US011312621B2

(12) United States Patent
Ho

(10) Patent No.: US 11,312,621 B2
(45) Date of Patent: Apr. 26, 2022

(54) SENSING THERMAL GRADIENTS WITHIN A MICROELECTROMECHANICAL DEVICE

(71) Applicant: InvenSense, Inc., San Jose, CA (US)

(72) Inventor: Gavin Ho, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 490 days.

(21) Appl. No.: 16/531,990

(22) Filed: Aug. 5, 2019

(65) Prior Publication Data

US 2020/0039818 A1 Feb. 6, 2020

Related U.S. Application Data

(60) Provisional application No. 62/715,853, filed on Aug. 8, 2018, provisional application No. 62/714,838, filed on Aug. 6, 2018.

(51) Int. Cl.
*B81B 7/00* (2006.01)
*G01L 19/00* (2006.01)

(52) U.S. Cl.
CPC ........ *B81B 7/0087* (2013.01); *G01L 19/0092* (2013.01); *B81B 2201/0235* (2013.01); *B81B 2201/0242* (2013.01); *B81B 2201/0257* (2013.01); *B81B 2201/0264* (2013.01); *B81C 2201/019* (2013.01)

(58) Field of Classification Search
CPC .......... B81B 7/0087; B81B 2201/0235; B81B 2201/0242; B81B 2201/0257; B81B 2201/0264; G01L 19/0092; B81C 2201/019; G01C 21/183; G01K 3/14; G01K 2217/00; G01K 7/02

USPC .......................................................... 73/497
See application file for complete search history.

(56) References Cited

U.S. PATENT DOCUMENTS

| 8,304,851 | B2 | 11/2012 | Trifonov | |
|---|---|---|---|---|
| 8,373,244 | B2* | 2/2013 | Mowry | ............... G01K 1/026 257/469 |
| 8,802,476 | B2 | 8/2014 | Trifonov | |
| 2014/0250969 | A1* | 9/2014 | Alagarsamy | .......... B81C 99/005 73/1.01 |
| 2017/0343421 | A1* | 11/2017 | Nakagawa | ............... G01K 3/14 |

OTHER PUBLICATIONS

Nagel et al., "Characterization of temperature gradients on MEMS acceleration sensors", Procedia Engineering 168 p. 888-891 (Year: 2016).*

* cited by examiner

*Primary Examiner* — Nathaniel T Woodward
(74) *Attorney, Agent, or Firm* — Haley Guiliano LLP; Joshua Van Hoven

(57) ABSTRACT

The performance of a microelectromechanical systems (MEMS) device may be subject to unwanted thermal gradients or nonuniform temperatures. The thermal gradients may be approximated based on voltage measurements taken through bond wires coupled to bond points located on the MEMS device. Thermal gradient measurement may be improved depending on the arrangement of bond wires and/or the material of the bond wires. Sense circuitry that is coupled to the MEMS device may determine corrective actions, such as updating the operation of the MEMS device, that compensate for the adverse effects from the thermal gradients.

20 Claims, 6 Drawing Sheets

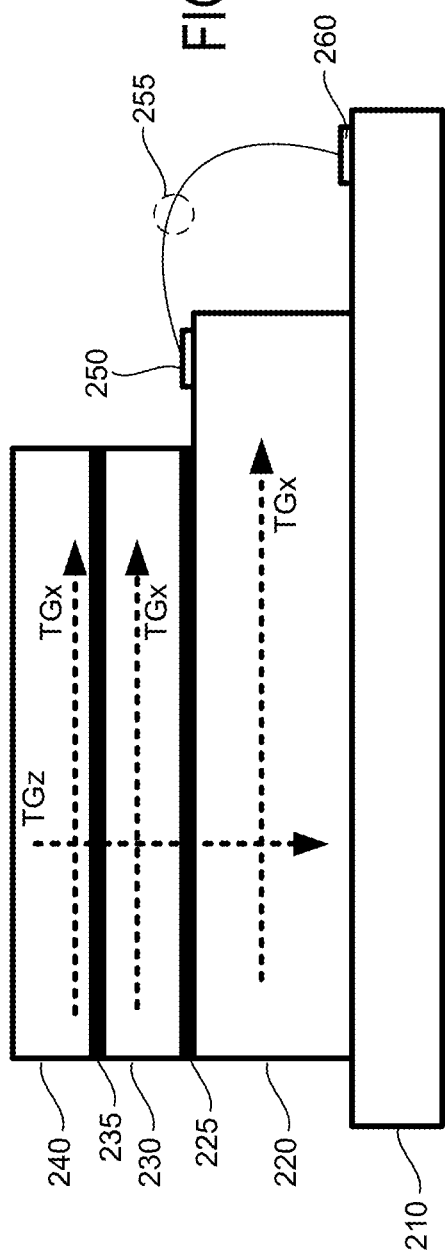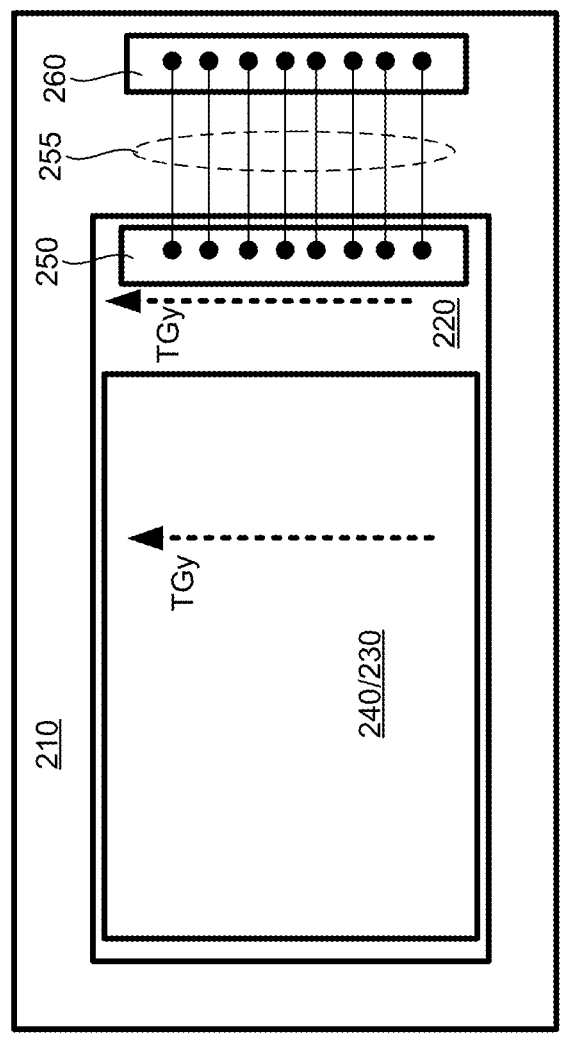

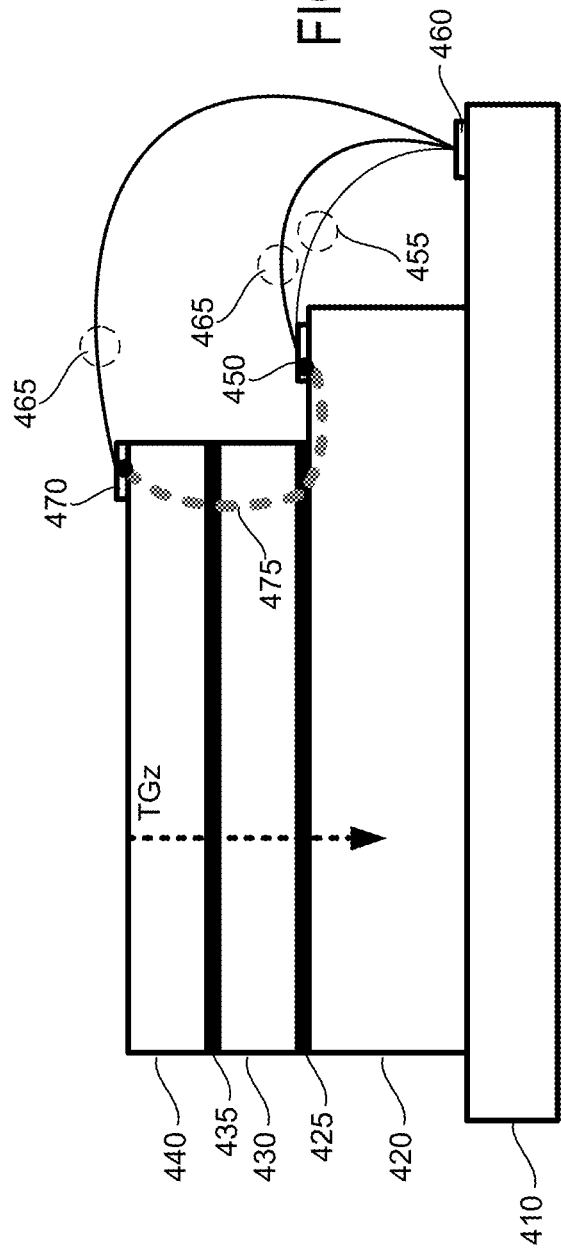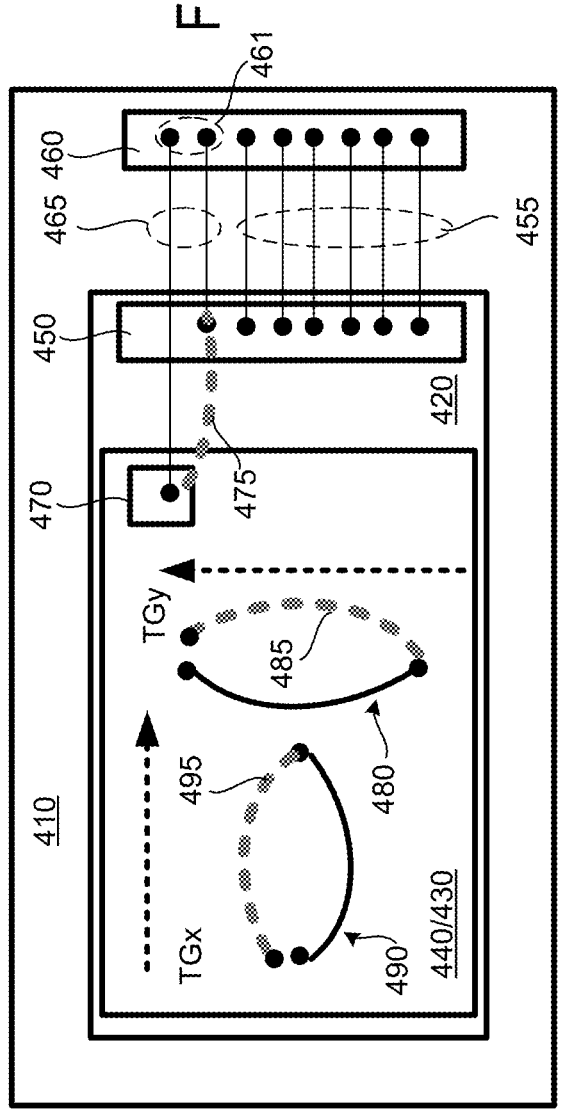

SENSING THERMAL GRADIENTS WITHIN A MICROELECTROMECHANICAL DEVICE

CROSS-REFERENCE TO RELATED APPLICATIONS

This application claims priority benefit under 35 U.S.C. § 119(e) from U.S. provisional application No. 62/714,838 entitled "Disparate Metallurgical Wires Within Electronic Apparatus," filed on Aug. 6, 2018, and from U.S. provisional application No. 62/715,853 entitled "Apparatus For Sensing Thermal Gradients Within An Electronic System," filed on Aug. 8, 2018. The aforementioned, earlier-filed applications are hereby incorporated by reference herein in their entireties.

BACKGROUND

Numerous items such as smartphones, smart watches, tablets, automobiles, aerial drones, appliances, aircraft, exercise aids, and game controllers utilize sensors during their operation (e.g., motion sensors, pressure sensors, temperature sensors, etc.). In commercial applications, microelectromechanical devices or sensors such as accelerometers and gyroscopes capture complex movements and determine orientation or direction. For example, smartphones are equipped with accelerometers and gyroscopes to augment navigation systems that rely on Global Position System (GPS) information. In another example, an aircraft determines orientation based on gyroscope measurements (e.g., roll, pitch, and yaw) and vehicles implement assisted driving to improve safety (e.g., to recognize skid or roll-over conditions).

Sensors are often one component of a larger system, and with the desire for commercial devices to become more integrated and compact, this larger system is packaged within an end-use device that may itself be compact (e.g., a smartphone). As the density of chips and microelectromechanical devices increases, there are a variety of manners in which they can impact each other or be impacted by the external environment, such as electromagnetic emissions, physical shocks, and exposure to temperature.

SUMMARY

In an embodiment of the present disclosure, a microelectromechanical (MEMS) sensor, comprises a plurality of vertically-stacked semiconductor layers, an external bond wire coupled to a first semiconductor layer of the plurality of semiconductor layers at a first bond point, and a second bond point coupled to the external bond wire at a second semiconductor layer of the plurality of semiconductor layers. The MEMS sensor may further comprise a sense circuit coupled to measure a voltage at the second bond point and to calculate a thermal gradient between the first bond point and the second bond point based on the measured voltage.

In an embodiment of the present disclosure, an electronic device comprises a plurality of vertically-stacked semiconductor layers, a first temperature circuit path between a first location on a first semiconductor layer of the plurality of semiconductor layers and a second location on a second semiconductor layer of the plurality of semiconductor layers, and a second temperature circuit path between the first location and a third location on the second semiconductor layer of the plurality of semiconductor layer, wherein the third location is located adjacent to the second location. The electronic device may further comprise processing circuitry configured to measure a voltage between the second location and the first location, determine a thermal gradient associated with the first and second temperature circuit paths based on the measured voltage, and modify the operation of the electronic device based on the thermal gradient.

In an embodiment of the present disclosure, a microelectromechanical (MEMS) sensor comprises a first temperature circuit path between a first location of the MEMS sensor and a second location of the MEMS sensor, and a second temperature circuit path between the first location of the MEMS sensor and a third location of the MEMS sensor, wherein the third location is adjacent to the second location and wherein the first and second temperature circuit paths define a thermal gradient path of the MEMS sensor. The MEMS sensor may also comprise processing circuitry configured to measure a voltage between the second location and the first location, determine a thermal gradient for the thermal gradient path based on the measured voltage, and modify the operation of the MEMS sensor based on the thermal gradient.

BRIEF DESCRIPTION OF DRAWINGS

The above and other features of the present disclosure, its nature, and various advantages will be more apparent upon consideration of the following detailed description, taken in conjunction with the accompanying drawings in which:

FIG. 2A shows an illustrative side view of a MEMS device having bond wires connected to respective layers of the device in accordance with some embodiments of the present disclosure;

FIG. 2B shows an illustrative top view of a MEMS device having bond wires connected to respective layers of the device in accordance with some embodiments of the present disclosure;

FIG. 4A shows an illustrative side view of a MEMS device utilizing bond wires and the MEMS device material as a thermocouple in accordance with some embodiments of the present disclosure;

FIG. 4B shows an illustrative top view of a MEMS device utilizing bond wires and the MEMS device material as a thermocouple in accordance with some embodiments of the present disclosure;

DETAILED DESCRIPTION OF DRAWINGS

Figure 1:
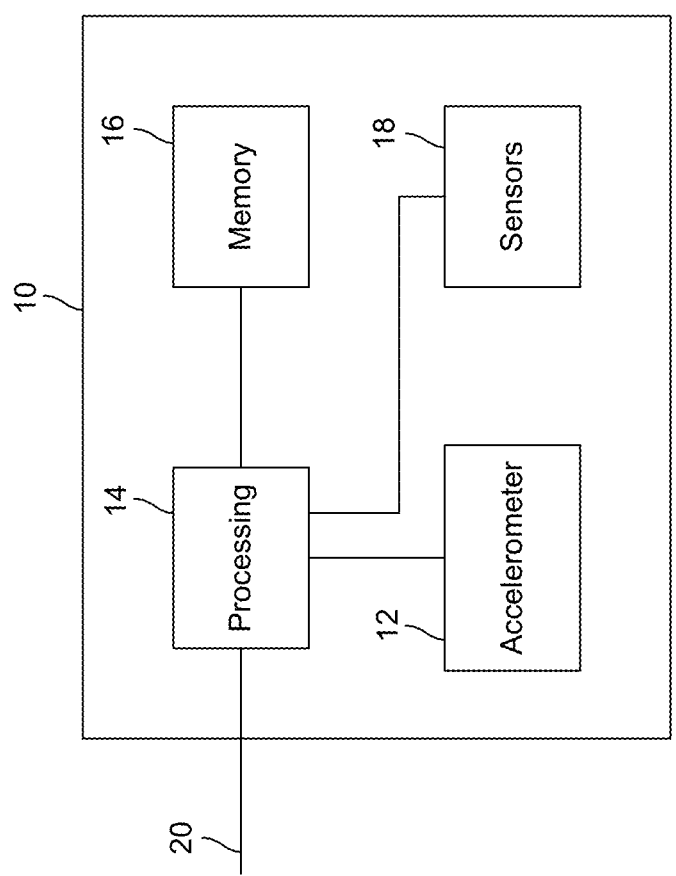
FIG. 1 shows an illustrative motion sensing system in accordance with an embodiment of the present disclosure.

A MEMS device is constructed of a number of layers such as a CMOS layer, a microelectromechanical system (MEMS) device layer, a cap layer, and handle (e.g., land grid array (LGA)) layer. The MEMS device may form a sensor such as an accelerometer, gyroscope, pressure sensor, temperature sensor, or fingerprint sensor. In integrated electronic system (e.g., a smartphone) may incorporate the sensor in a network of densely packed circuitry. This system may expose the MEMS device to a heat source that causes a thermal gradient or non-uniform temperature across the MEMS device. A heat source such as an adjacent electronic component or the external environment may apply thermal energy to a portion of the MEMS sensor, which may be applied in a variety of manners depending on the nature of the heat source. For example, based on relative location, layout, and configuration heat sources may apply thermal energy to a small portion or point of the MEMS sensor and any layer thereof, while in other instances the thermal energy may be distributed about the MEMS sensor relatively evenly. The applied thermal energy may impact the sensor, for example, by causing the expansion or movement of particular components in a manner that modifies the mechanical motion of the MEMS sensor, or by changing the operational range of electronic components.

A non-uniform distribution of thermal energy throughout the MEMS sensor may occur, for example, when a heat source is applied occasionally in a manner such that the thermal energy is experienced by a portion of the MEMS sensor but the thermal energy does not distribute completely throughout the MEMS structure. Thermal gradients may result, causing unpredictable temperature effects on different portions of the MEMS sensor, i.e., based on the relative temperature at different micromechanical and electrical components. Effects of thermal gradients on MEMS devices may include the creation of pressure or thermal expansion within the device. Unwanted forces within the MEMS device, such as a motion sensor, corrupt measurements that should only be a result of forces due to motion.

Temperature measurement points may be established at different locations of the MEMS sensor in order to identify thermal gradients. Thermal gradients may be established from the temperature measurement points by measuring respective voltages at the measurement points, which in turn, may be based on respective voltage/temperature paths through disparate materials such as vias, semiconductor layers, bonding layers, bond wires, and other similar paths. Based on knowledge about the respective materials and construction of the respective paths and the voltages measured at the locations, a temperature difference between the two locations may be determined. In some embodiments, multiple different measurement locations may provide for measurements of different gradients, e.g., along different axes or paths within the MEMS sensor, resulting in the acquisition of information to acquire a two-dimensional or three-dimensional understanding of thermal gradients within the MEMS device.

The operation of the MEMS device may be modified based on the measured thermal gradient information. In some instances, parameters such as drive voltages, scaling factors, filter parameters, compensation signals, and other operational characteristics of the MEMS sensor may be modified in real-time based on measured thermal gradient information. Self-tests may also be performed to identify changes in performance during operation in the field, for example, by applying known self-test signals to the sensors and measuring resulting outputs with particular measured thermal gradients. Operational parameters of the MEMS sensor may then be updated based on measured responses for the particular sensor, which may be unique to particular end-use products or environments. The measured thermal gradient information may also be analyzed with other information such as measurements from other systems to associate thermal gradients with particular operational conditions, such as faults or failures in adjacent components.

FIG. 1 depicts an exemplary motion sensing system 10 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the motion sensing system may include at least a MEMS accelerometer 12 and supporting circuitry, such as processing circuitry 14 and memory 16. In some embodiments, one or more additional sensors 18 (e.g., additional MEMS accelerometers, MEMS gyroscopes, MEMS microphones, MEMS pressure sensors, and a compass) may be included within the motion processing system 10 to provide an integrated motion processing unit ("MPU") (e.g., including 3 axes of MEMS gyroscope sensing, 3 axes of MEMS accelerometer sensing, microphone, pressure sensor, and compass).

Processing circuitry 14 may include one or more components providing necessary processing based on the requirements of the motion processing system 10. In some embodiments, processing circuitry 14 may include hardware control logic that may be integrated within a chip of a sensor (e.g., on a substrate or cap of an accelerometer 12 or other sensor 18, or on an adjacent portion of a chip to the accelerometer 12 or other 18) to control the operation of the accelerometer 12 or other sensor 18 and perform aspects of processing for the accelerometer 12 or other sensor 18. In some embodiments, the accelerometer 12 and other sensors 18 may include one or more registers that allow aspects of the operation of hardware control logic to be modified (e.g., by modifying a value of a register). In some embodiments, processing circuitry 14 may also include processor such as a microprocessor that executes software instructions, e.g., that are stored in memory 16. The microprocessor may control the operation of the accelerometer 12 by interacting with the hardware control logic, and process signals received from accelerometer 12. The microprocessor may interact with other sensors in a similar manner.

Although in some embodiments (not depicted in FIG. 1), the accelerometer 12 or other sensors 18 may communicate directly with external circuitry (e.g., via a serial bus or direct connection to sensor outputs and control inputs), in an embodiment the processing circuitry 14 may process data received from the accelerometer 12 and other sensors 18 and communicate with external components via a communication interface 20 (e.g., a SPI or I2C bus, or in automotive applications, a controller area network (CAN) or Local Interconnect Network (LIN) bus). The processing circuitry 14 may convert signals received from the accelerometer 12 and other sensors 18 into appropriate measurement units (e.g., based on settings provided by other computing units communicating over the communication bus 20) and perform more complex processing to determine measurements such as orientation or Euler angles, and in some embodiments, to determine from sensor data whether a particular activity (e.g., walking, running, braking, skidding, rolling, etc.) is taking place.

In some embodiments, certain types of information may be determined based on data from multiple accelerometers 12 and sensors 18, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

In some circumstances, measured voltages may falsely or incorrectly indicate acceleration when other phenomena (e.g., thermal gradients, electrical noise, etc.) affect the measured voltage of an exemplary MEMS accelerometer (e.g., accelerometer 12). Thermal gradients affecting the MEMS accelerometer may be determined based on voltage measurements from measurement points (e.g., via one or more external bond wires) between locations (e.g., respective locations on different layers) of the MEMS accelerometer or associated with a single layer of the MEMS accelerometer. Processing circuitry (e.g., processing circuitry 14) associated with the MEMS accelerometer may determine a corrective action (e.g., updating operations) to take in response to a thermal gradient that has been detected within the MEMS accelerometer.

FIG. 2A shows an illustrative side view of a MEMS device having bond wires connected to respective layers of the device in accordance with some embodiments of the present disclosure. As depicted in FIG. 2A, there is a thermal gradient TGx in the x-direction and a thermal gradient TGz in the z-direction. FIG. 2B shows an illustrative top view of a MEMS device having bond wires connected to respective layers of the device in accordance with some embodiments of the present disclosure. As depicted in FIG. 2B, there is a thermal gradient TGy in the y-direction.

The MEMS device depicted comprises LGA substrate 210, which is the foundation for active layers grown over it such as CMOS layer 220 and MEMS device layer 230. An insulating bonding layer 225 exists between CMOS layer 220 and MEMS device layer 230. To protect MEMS device layer 230, cap layer 240 overlays MEMS device layer 230 with a bonding layer 235 between the two layers that provides electrical insulation. The device is shown to be experiencing thermal gradients in directions TGx and TGz that indicate a thermal gradient in the x-axis and a thermal gradient in the z-axis, respectively. The thermal gradient arrow as depicted may signal an increasing temperature in the negative z-axis (e.g., from LGA substrate 210 towards cap layer 240). Likewise, the thermal gradient arrow as depicted may signal an increasing temperature in the positive x-axis (e.g., in the direction towards bond wires 255). For example, a heat source next to the MEMS device that is closest to both cap layer 240 and bond wires 255 causes an increasing thermal gradient in the directions of TGx and TGz. Depending upon the nature of the source of thermal energy and the components and configuration of the MEMS device, the thermal gradients may be linear, exponential, or may distribute through the MEMS device in other manners over distance from a source of heat. Bond pads 250 and 260 are the locations of bond points at both ends of bond wires 255. Bond pads may have a plurality of bond wires between them. The bond wires located between CMOS layer 220 and LGA substrate 210 may provide a signal path for transmitting signals processed within the CMOS layer 220 to external components and circuitry, e.g., via electrical connections to LGA layer 210. The bond wires may also provide signals to the CMOS layer. For example, signals transmitted via the bond wires may be used to transmit measured values, commands, register values, etc.

Figure 3A:
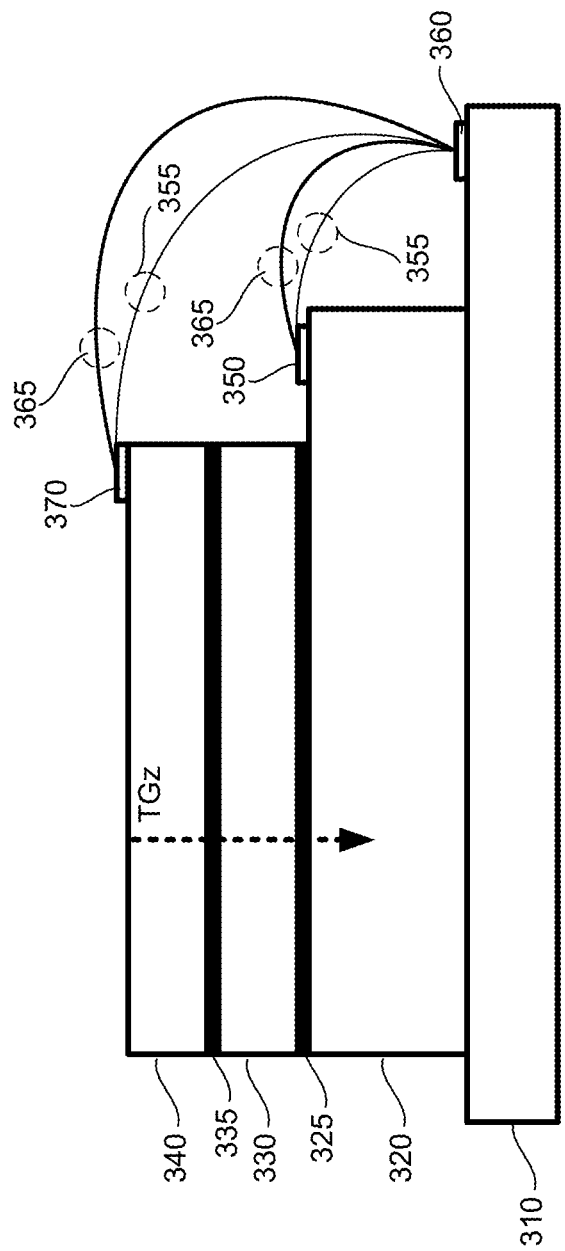
FIG. 3A shows an illustrative side view of a MEMS device having bond wires connected to respective layers of the device in accordance with some embodiments of the present disclosure.
Figure 3B:
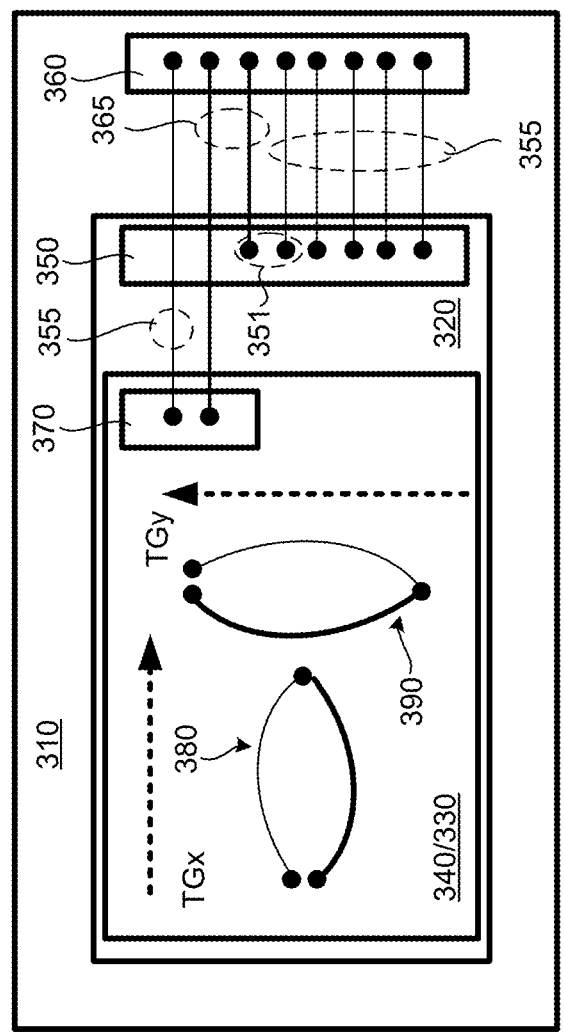
FIG. 3B shows an illustrative top view of a MEMS device having bond wires connected to respective layers of the device in accordance with some embodiments of the present disclosure.

FIG. 3A shows an illustrative side view of a MEMS device having bond wires 355 and 365 of different materials associated with respective portions of the MEMS device in accordance with some embodiments of the present disclosure. FIG. 3B shows an illustrative top view of the MEMS device of FIG. 3A having bond wires associated with three layers of the device in accordance with some embodiments of the present disclosure.

An exemplary MEMS device comprises a cap layer 340 bonded to a MEMS layer 330 by bonding layer 335, a CMOS layer 320 bonded to MEMS layer 330 by bonding layer 325, and an LGA substrate 310 coupled to the CMOS layer. Bond wires, some of material 355 and some of material 365, connect between layers of the MEMS device. Bond wires 355 and 365 are located between bond pads 370 and 360 and between bond pads 350 and 360. The arrangement of bond wires 355 and 365, as shown in the side view, may set a foundation for voltage measurements to be communicated from within the MEMS device (e.g., thermocouples within the layers) to a sense circuit that is coupled to the MEMS device. In some embodiments, bond wires 365 and 355 are used to ground cap layer 340 through LGA substrate 310. In some embodiments, bond wires 355 and 365 are used to determine the thermal gradients between LGA substrate 310 and CMOS layer 320 and the thermal gradients between LGA substrate 310 and cap layer 340.

In addition to transmitting signals between layers, the bond wires may also be used to measure temperature information, based on measured voltages at particular locations. Different bond wires (e.g., respective bond wires 355 and 365) may be constructed of different materials, such that each respective wire has different thermoelectric properties, such as aluminum, copper, silver, and gold. The bond wires of different material may be used to form a thermocouple, and temperature difference between two measurement points (e.g., bond pads) may be determined based on respective voltages measured across the bond wires. For example, in the embodiment depicted in FIGS. 3A and 3B, a thermal gradient between bond pad 370 and 360 may be measured based on bond wires of different materials 355 and 365 between bond pad 370 and bond pad 360. The upper two bond wires of materials 355 and 365 are located in close proximity on both bond pads 370 and 360, and the voltage difference between those two bond wires may be measured at an appropriate location (e.g., across the bonding points of bond pad 360 of the handle/LGA substrate). This voltage and known properties of the bond wires may then be used to measure the thermal gradient between bond pads 370 and 360. As another example, in the embodiment depicted in FIGS. 3A and 3B, a thermal gradient between bond pad 370 and 350 may be measured based on bond wires of different materials 355 and 365 between bond pad 370 and bond pad 350 (not depicted), or by series interconnected bond wires that connect to bond pad 350 via bond pad 360. The upper four bond wires of materials 355 and 365 are located in close proximity on all of bond pads 370, 360, and 350. A series connection between common bond wire materials 355/365 at bond pad 360 (not depicted) may provide a continuous thermocouple connection between bond pad 370 and bond pad 350, allowing the thermocouple voltage representative of the thermal gradient between bond pad 370 and bond pad 350 to be measured as a voltage at bond pad 350 (e.g., across bonding locations 351). In the exemplary embodiment of FIGS. 3A and 3B, additional bond wires (e.g., the bottom four bond wires labeled 355) may not perform a thermocouple function and may be used only for conventional transmission of signals. In some embodiments, bond wires that function as a thermocouple may perform a single thermocouple function, while in other embodiments these bond wires may also transmit other signals, with the thermocouple measurement function being performed at times when a signal is not being transmitted (e.g., periodically during operation), at startup, or with the thermocouple (e.g., DC) signal being filtered from the underlying transmitted signal for processing.

In this manner, the voltage values measured at respective bonding locations by the thermocouple may in turn be based on the temperatures at the bonding locations and the materials of the bonding wires, e.g., based on Seebeck coefficients that characterize materials by their thermoelectric voltage properties. Bond wires connect bond points located at bond pads at different physical locations of the MEMS sensors, such that respective bond pads (e.g., bond pads 350, 360, and 370) may have different temperatures as reflected by the thermal gradients in directions TGx, TGy and TGz. For example, bond pad 350 is at a lower temperature than bond pad 370 when temperature increases in the directions of TGz and TGx as depicted by the arrows of FIGS. 3A and 3B. Further in this example, based on the voltages measured at the ends of bond wires of different materials, a sense circuit that is coupled to the MEMS device may determine the thermal gradient or temperature difference between bond pads or other measurement locations.

The Seebeck effect can be captured by Equation 1.

$$(V_{bp2} - V_{bp1}) = -S(T_{l2} - T_{l1}) \quad \text{(Eq. 1)}$$

where $V_{bp1}$ and $V_{bp2}$ are the voltages measured at a first bond point and a second bond point (e.g., on bond pad 350), $T_{l1}$ and $T_{l2}$ are the corresponding temperatures at the locations that are connected by the bond wires by the different materials (e.g., bond pads 370 and 350), and S is the relative Seebeck coefficient of the two materials (e.g., bond wires 355 and 365).

Determining thermal gradients allows the MEMS system to identify and/or compensate for temperature effects on the operations of the MEMS device due to nearby heat sources, for example, due to respective expansion or contraction of materials are changes in pressure within a cavity of the MEMS device. The system may have a pre-populated table of thermal gradients and corresponding correction mechanisms to update the operation of the MEMS device or associated MEMS system. This process for updating operations of a MEMS device will be described in further detail in the description of FIG. 6. In some embodiments, a gradient may be identified as a change over a unit of distance that is approximated by a scalar difference over a unit of distance, e.g., as a change in temperature across a change in some unit measuring distance along a combination of x-axis, y-axis, and z-axis directions. In other embodiments, as described herein, thermal gradients may be determined at a variety of locations in multiple different manners (e.g., including multiple x-direction, y-direction, and z-direction measurements), enabling two-dimensional or three-dimensional measurement and analysis of thermal gradients. In some embodiments, more complex thermal gradients may be performed only occasionally (e.g., during manufacturing, at startup, or periodically) to set or adjust compensation and measurement factors that are based on measured thermal gradients, for use with scalar thermal gradients that can be quickly and easily measured and processed during operation of the MEMS device.

In some embodiments, the MEMS device may also comprise temperature sensors that are used to measure absolute temperature values. For example, the temperature of the MEMS device can be measured by a temperature sensor, such as a thermistor, that determines an absolute temperature associated with the MEMS sensor. In some embodiments, such absolute temperature measurements may be combined with the thermal gradient information measured herein to perform compensation for the MEMS sensor.

In some embodiments, thermocouples may also be located on or within layers of the MEMS device, such as cap layer 340, MEMS device layer 330, CMOS layer 320, or LGA layer 310. For example, in FIG. 3B a first thermocouple 380 of two different wire materials is depicted as measuring an x-direction thermal gradient, e.g., with external bond wires connected at a common point and extending along the x-direction to a voltage measurement location for determining a voltage difference. Similarly, a second thermocouple 390 of two different wire materials is depicted as measuring a y-direction thermal gradient, e.g., with external bond wires connected at a common point and extending along the y-direction to a voltage measurement location for determining a voltage difference. Although not depicted in FIG. 3B, the measured voltages corresponding to the thermocouples 380 and 390 may be provided to the CMOS and/or LGA layer for processing by internal via connections (e.g., through one or more layers of the MEMS device) and/or bond wires (e.g., additional bond wire connections to CMOS layer 320). In some embodiments, the thermocouple wires may be patterned in the semiconductor layers of the MEMS sensor, e.g., by patterning conductive tracks of different material that are connected at a common point (e.g., by a via between different vertical portions of the CMOS layer or a via between top and bottom surfaces of the MEMS layer) and travel along a predetermined path to voltage measurement points. Those voltages may then be processed within the MEMS device (e.g., within the CMOS layer) or may be transmitted (e.g., digitized and transmitted) to external components for further processing and compensation.

In the exemplary embodiment of FIGS. 3A-3B, there is a thermal gradient in direction TGz corresponding to a heat source closest to cap layer 340 and furthest from LGA substrate 310. The thermal gradient within each of the layers of the MEMS device may be measured using bond wires within the respective layers.

A thermal gradient may be measured between CMOS layer 320 and LGA substrate 310. For example, using bond wires of materials 355 and 365 that are connected directly between CMOS layer 320 and LGA substrate 310 (e.g., the third and fourth bond wires from the top), the Seebeck effect may be used to calculate the thermal gradient between bond pad 350 and bond pad 360. This thermal gradient may estimate the thermal gradient between the two associated layers.

A thermal gradient may be measured between cap layer 340 and LGA substrate 310. For example, using bond wires of materials 355 and 365 that are connected directly between cap layer 340 and LGA substrate 310 (e.g., the first and second bond wires from the top), the Seebeck effect may be used to calculate the thermal gradient between bond pad 370 and bond pad 360. This thermal gradient may estimate the thermal gradient between the two associated layers.

Bond wires 355 and 365 may also be used to measure the thermal gradient between CMOS layer 320 and cap layer 340. As depicted in FIGS. 3A-3B, a first bond wire of material 355 may be connected between bond pad 370 at cap layer 340 to bond pad 360 on LGA substrate 310, while a second bond wire of material 355 may be connected between bond pad 360 on LGA substrate 310 to bond pad 350 at CMOS layer 320. These two bond wires of material 355 may be connected in series (e.g., selectively connected by a transistor or switch of LGA substrate 310 or associated circuitry) to provide a direct connection of bond wire of material 355 from bond pad 370 of cap layer 340 to a bond point 351 of bond pad 350 of CMOS layer 320. As is also depicted in FIGS. 3A-3B, a second bond wire of material 365 may be connected between bond pad 370 at cap layer 340 to bond pad 360 on LGA substrate 310, while a second bond wire of material 365 may be connected between bond pad 360 on LGA substrate 310 to bond pad 350 at CMOS layer 320. These two bond wires of material 365 may be connected in series (e.g., selectively connected by a transistor or switch of LGA substrate 310 or associated circuitry) to provide a directly connection of bond wire of material 365 from bond pad 370 of cap layer 340 to a bond point 351 of bond pad 350 of CMOS layer 320. A voltage may be measured across bond points 351 which is representative of the temperature difference between the bond pad 370 of cap layer 340 and the bond pad 350 of CMOS layer 320.

FIG. 4A shows an illustrative side view of a MEMS device utilizing bond wires and the MEMS device material as a thermocouple in accordance with some embodiments of the present disclosure, while FIG. 4B shows an illustrative top view of a MEMS device utilizing bond wires and the MEMS device material as a thermocouple in accordance with some embodiments of the present disclosure. An exemplary MEMS device comprises a cap layer 440 bonded to a MEMS layer 430 by bonding layer 435, a CMOS layer 420 bonded to MEMS layer 430 by bonding layer 425, and an LGA substrate 410 coupled to the CMOS layer. Bond wires, some of material 455 and some of material 465, connect between layers of the MEMS device. Bond wires of material 465 are located between bond pads 470 and 460 and between bond pads 450 and 460, while bond wires of material 455 are located between bond pads 450 and 460. In the exemplary embodiment depicted and described with respect to FIGS. 4A and 4B, the bond wires form a first material for a thermocouple while the semiconductor material of the MEMS device forms a second material of the thermocouple, with the relative Seebeck coefficient based on the bond wire material and the semiconductor material.

The bond wires of particular materials may be used to form a thermocouple with the underlying semiconductor material of the MEMS device, and temperature difference between two measurement points (e.g., bond pads) may be determined based on respective voltages measured between a bonding point of a bond wire and a voltage measurement point for the semiconductor material (e.g., a pad or via location). For example, in the embodiment depicted in FIGS. 4A and 4B, a thermal gradient between bond pad 470 and 450 may be measured based on a bond wire 465 of a first material and semiconductor path 475 through the respective semiconductor and bonding materials of the MEMS device between bond pad 470 and bond pad 450. The semiconductor path is a virtual path that connects between the bonding point of the bond wire of material 465 at the bond pad 470 of cap layer 440 to a voltage measurement point (e.g., a pad or via) proximate to the bond point of series connected wires (e.g., via a connection, transistor, or switch at bonding points 461) of material 465 at bond pad 450 at CMOS layer 420. In some embodiments (not depicted in FIGS. 4A-4B), the bond wire of material 465 may connect directly between bond pad 470 and bond pad 450, rather than connecting through series bond wires connected at bond pad 460. Similarly, although not depicted in FIGS. 4A-4B, a virtual semiconductor path also exists between the bonding point of the bond wire of material 465 at the bond pad 470 of cap layer 440 and the bond point of the bond wire of material 465 at bond pad 460 of LGA substrate 410. This latter virtual semiconductor path facilitates measurement of a thermal gradient between bond pad 470 and bond pad 460.

Although not depicted in FIGS. 3A-3B and FIGS. 4A-4B, the thermocouples constructed from bond wires, thermocouples constructed by patterning of conductive materials within semiconductor layers, and thermocouples at least partially constructed from virtual semiconductor paths may be combined to provide thermal gradient measurement points and paths. For example, thermal gradients may be measured most accurately by thermocouples formed of known materials and relatively simple measurement paths, such as thermocouples constructed from bond wires and thermocouples constructed of relatively simple conductive circuit paths within semiconductor layers. These may provide accurate thermal gradient measurements but may be limited in the location and number of thermal gradients that may be measured. In some embodiments, thermal gradient measurements may additionally be performed using more complex circuit paths within semiconductor layers and/or virtual semiconductor paths to measure thermal gradients in locations and/or devices where these are the only available measurement paths. In some embodiments, combination of numerous higher-accuracy and lower-accuracy temperature measurements may facilitate the construction of complex three-dimensional models of thermal gradients throughout a MEMS device under different operating conditions.

In some embodiments, thermocouples utilizing a semiconductor material path may also be located on or within layers of the MEMS device, such as cap layer 440, MEMS device layer 430, CMOS layer 420, or LGA layer 410. For example, in FIG. 4B a first thermocouple 490 of a bond wire material and a virtual semiconductor path 495 is depicted as measuring an x-direction thermal gradient, e.g., with an external bond wire connected at a temperature measurement point and extending along the x-direction to a voltage measurement location for determining a voltage difference between the bond wire and a voltage of the semiconductor material (e.g., at a pad or via adjacent to the voltage measurement point of the bond wire). Similarly, a second thermocouple 480 of a bond wire material and a virtual semiconductor path 485 is depicted as measuring a y-direction thermal gradient, e.g., with an external bond wire connected at a temperature measurement point and extending along the y-direction to a voltage measurement location for determining a voltage difference between the bond wire and a voltage of the semiconductor material (e.g., at a pad or via adjacent to the voltage measurement point of the bond wire). Although not depicted in FIG. 4B, the measured voltages corresponding to the thermocouples 480 and 490 may be provided to the CMOS and/or LGA layer for processing by internal via connections (e.g., through one or more layers of the MEMS device) and/or bond wires (e.g., additional bond wire connections to CMOS layer 420). In some embodiments, the thermocouple wires may be patterned in the semiconductor layers of the MEMS sensor, e.g., by patterning conductive tracks of different material that are connected at a common point (e.g., by a via between different vertical portions of the CMOS layer or a via between top and bottom surfaces of the MEMS layer) and travel along a predetermined path to voltage measurement points adjacent to semiconductor path voltage measurement points. Those voltages may then be processed within the MEMS device (e.g., within the CMOS layer) or may be transmitted (e.g., digitized and transmitted) to external components for further processing and compensation.

In the exemplary embodiment of FIGS. 4A-4B, there is a thermal gradient in direction TGz corresponding to a heat source closest to cap layer 440 and furthest from LGA substrate 410. The thermal gradient within each of the layers of the MEMS device may be measured using bond wires and virtual semiconductor paths within the respective layers.

A thermal gradient may be measured between CMOS layer 420 and LGA substrate 410, for example, using a bond wire of material 465 that is connected directly between CMOS layer 420 and LGA substrate 410 and a virtual semiconductor path and associated voltage measurement point. The Seebeck effect may be used to calculate the thermal gradient between bond pad 470 and bond pad 450 based on a measured voltage between the bond point of the bond wire and an adjacent voltage measurement point for the virtual semiconductor path.

A thermal gradient may be measured between cap layer 440 and LGA substrate 410 for example, using a bond wire of material 465 that is connected directly between cap layer 420 and LGA substrate 410 and a virtual semiconductor path and associated voltage measurement point. The Seebeck effect may be used to calculate the thermal gradient between bond pad 470 and bond pad 460 based on a measured voltage between the bond point of the bond wire and an adjacent voltage measurement point for the virtual semiconductor path.

A bond wire (e.g., of material 465) and virtual semiconductor path may also be used to measure the thermal gradient between CMOS layer 420 and cap layer 440. As depicted in FIGS. 4A-4B, a first bond wire of material 465 may be connected between bond pad 470 at cap layer 440 to bond pad 460 on LGA substrate 410, while a second bond wire of material 465 may be connected between bond pad 460 on LGA substrate 410 to bond pad 450 at CMOS layer 420. These two bond wires of material 465 may be connected in series (e.g., selectively connected by a transistor or switch of LGA substrate 410 or associated circuitry) to provide a direct connection of bond wire of material 455 from bond pad 470 of cap layer 440 to a bond point 451 of bond pad 450 of CMOS layer 420. As is also depicted in FIGS. 4A-4B, a virtual semiconductor path 475 may be connected between bond pad 470 at cap layer 440 to a semiconductor measurement location adjacent to bond pad 450 at CMOS layer 420. A voltage may be measured from the bond point that the bond wire is connected to and the semiconductor measurement location, which is representative of the temperature difference between the bond pad 470 of cap layer 440 and the bond pad 450 of CMOS layer 420.

Figure 5A:
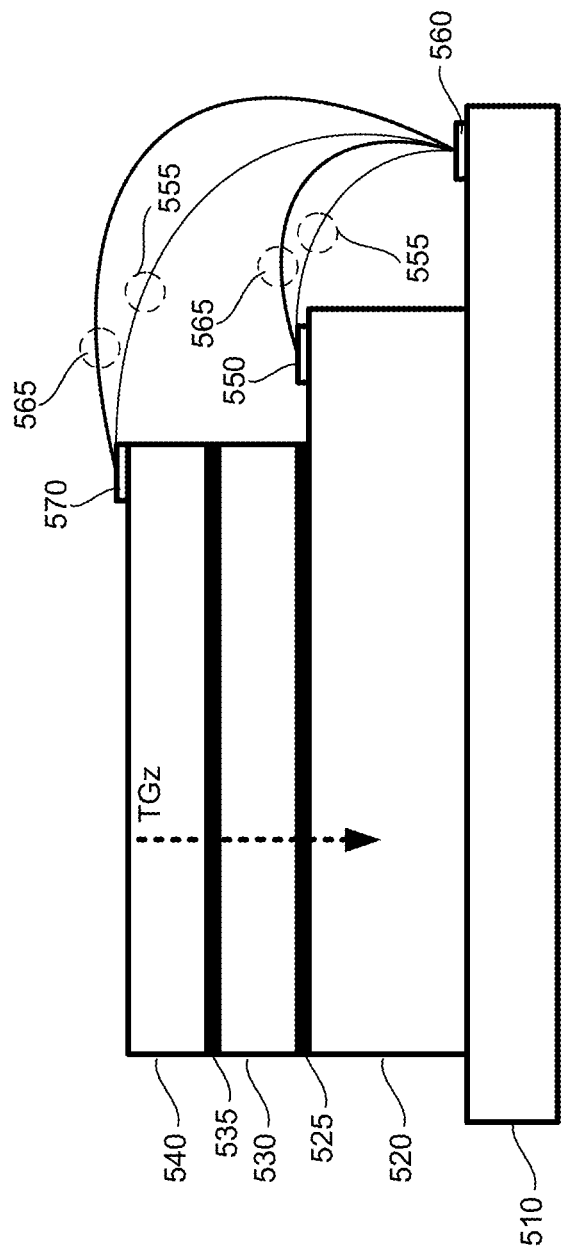
FIG. 5A shows an illustrative side view of a MEMS device having bond wires in series in accordance with some embodiments of the present disclosure.
Figure 5B:
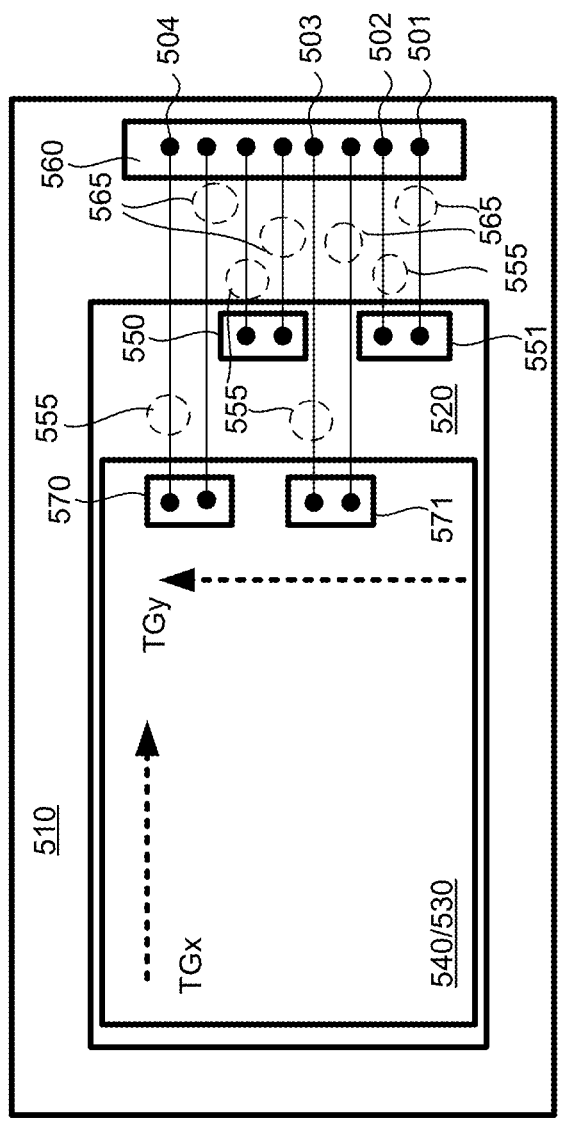
FIG. 5B shows an illustrative top view of a MEMS device having bond wires in series in accordance with some embodiments of the present disclosure.

FIG. 5A shows an illustrative side view of a MEMS device having bond wires in series in accordance with some embodiments of the present disclosure, while FIG. 5B shows an illustrative top view of a MEMS device having bond wires in series in accordance with some embodiments of the present disclosure. An exemplary MEMS device comprises a cap layer 540 bonded to a MEMS layer 530 by bonding layer 535, a CMOS layer 520 bonded to MEMS layer 530 by bonding layer 525, and an LGA substrate 510 coupled to the CMOS layer. Bond wires, some of material 555 and some of material 565, connect between layers of the MEMS device. Bond wires 555 and 565 are arranged among bond pads 550, 551, 560, 570, and 571.

In the exemplary embodiment of FIGS. 5A-5B, external bond wires are used to form a set of series-connected thermocouples that enable thermal gradient measurements to be performed between a variety of different locations along a variety of different paths, facilitating selective measurement of different thermal gradients with different accuracies. Although not depicted in FIGS. 5A-5B, switching circuitry may selectively connect different bonding points to measurement circuitry to determine a voltage difference relative to another bond point or measurement point, or to selectively connect bonding points to each other to enable series-connected measurement paths. Although not depicted in FIGS. 5A-5C, virtual semiconductor paths and in-layer measurement paths (e.g., via conductive traces of disparate materials) may also be selectively measured and connected, in a manner that facilitates measurement of complex two-dimensional and three-dimensional thermal gradients within a MEMS device.

In the exemplary embodiment of FIGS. 5A-5B, the selective connection or measurement of the bond wires of materials 555 and 565 may enable a variety of thermal gradient measurements. In an exemplary embodiment, at each respective bond pad between bond pads 570 and 551 (i.e., bond pad 560, bond pad 550, bond pad 560, and bond pad 571) bond wires of like material (i.e., material 555 or material 565) may be connected in series to create two continuous bond wire paths of respective materials 555 and 565 between bond pad 570 and bond pad 551. By connecting the bond points of bond pad 570 and measuring the voltage between the bond points of bond pad 551, an accurate thermal gradient measurement (e.g., based on relatively lengthy bond wire paths) may be obtained.

By connecting or switching the bond points in different configurations, a variety of thermal gradients along different axes may be measured. For example, by connecting the bond points 570 to create a temperature measurement point and measuring the voltage across the upper-most bond points of bond pad 560, a thermal gradient in the z-direction and x-direction from the cap layer 540 to the LGA substrate 510 may be measured. By connecting the bond points 570 to create a temperature measurement point and series connecting the bond wires to measure the voltage across the bond points of bond pad 550, a thermal gradient in the z-direction, x-direction and y-direction may be measured between the cap layer 540 and the CMOS layer 550. By connecting the bond points 570 to create a temperature measurement point and series connecting the bond wires to measure the voltage across the bond points of bond pad 571, a thermal gradient in the y-direction may be measured across a portion of the cap layer 540. By connecting the bond points 570 to create a temperature measurement point and measuring the voltage across the lower-most bond points of bond pad 560, a thermal gradient in the z-direction, x-direction, and y-direction from the cap layer 540 to the LGA substrate 510 may be measured. Finally, by connecting the bond points 570 to create a temperature measurement point and series connecting the bond wires to measure the voltage across the bond points of bond pad 551, a thermal gradient in the z-direction, x-direction and y-direction may be measured between the cap layer 540 and the CMOS layer 550, that includes a larger y-direction measurement across the MEMS device.

Although the above thermal gradient measurement paths were described with respect to a temperature measurement point at bond pad 570, it will be understood that any of the bond points within a bond pad or layer could be connected to form an initial temperature measurement point, and connected (e.g., via switching components) to measure a variety of suitable thermal gradients with respect to that temperature measurement point. In this manner, the system may selectively acquire thermal gradient measurements covering numerous thermal gradients and with different accuracies, to encompass different measurement and compensation scenarios.

Figure 6:
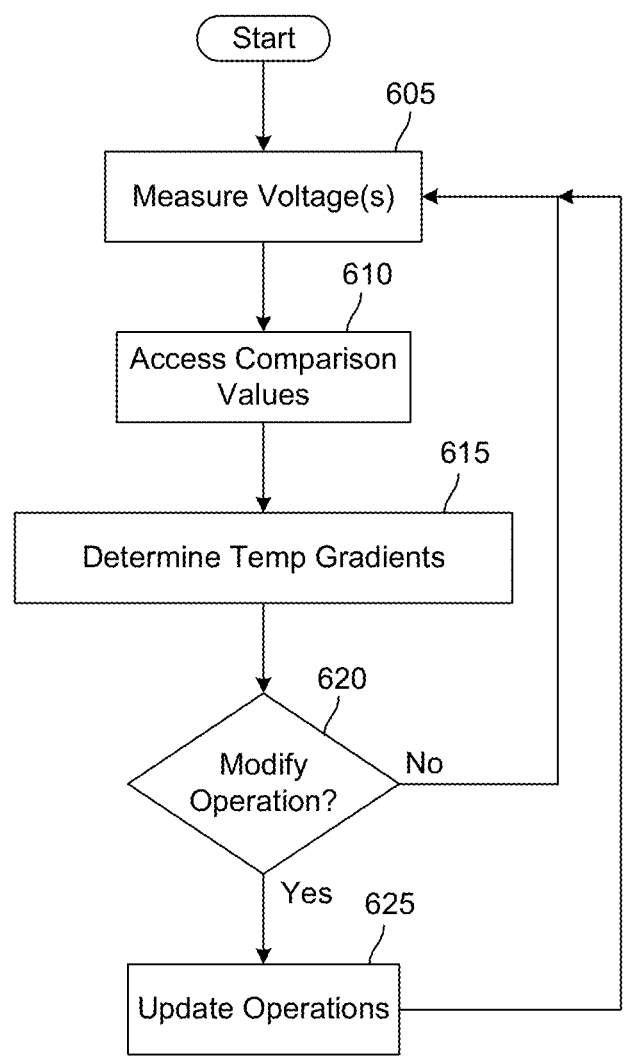
FIG. 6 depicts an illustrative flowchart of a process for modifying operations of a MEMS device based on a measured thermal gradient in accordance with some embodiments of the present disclosure.

FIG. 6 depicts an illustrative flowchart of a process for updating operations of a device. Although a particular set of steps is depicted in a particular sequence in FIG. 6, it will be understood that one or more steps may be added or omitted and that the sequences of steps may be modified. Although the steps of FIG. 6 may be described within the context of the MEMS devices depicted and described in FIGS. 1-5B herein, it will be understood that the thermocouples, measurement and switching circuitry, and compensation techniques may be implemented in semiconductor devices that do not include MEMS components.

At step 605, the system measures at least one voltage or voltage difference associated with a thermocouple of the device. In an exemplary embodiments, multiple thermocouples are associated with multiple thermal gradients within the device, including in the x-direction, y-direction, and z-direction. The exemplary thermocouples may include multiple material combinations having different relative Seebeck coefficients, such as bond wires made of disparate materials, conductive traces of different materials within semiconductor layers, virtual semiconductor paths, or any suitable combination thereof. In some embodiments as described herein, measurement points may be modified or switched to perform particular thermal gradient measurements. Once the relevant voltage measurements have been performed, processing may continue to step 610.

At step 610, the system accesses comparison values for use in converting the measured voltages of step 605 into thermal gradient values. Based on the particular measurements performed at step 605 and the respective materials and measurement paths of the respective temperature measurement circuits, comparison values (e.g., based on relative Seebeck coefficients) may be accessed. Once the comparison values have been accessed, processing may continue to step 615.

At step 615, the system determines thermal gradients based on the comparison values accessed in step 610. Each measured voltage may correspond to a temperature measurement between two different locations of the device, and may correspond to a particular comparison value based on the respective materials and temperature circuit path. Thermal gradients may be calculated for each of the voltages, and in some embodiments, some thermal gradient values may be normalized and/or combined into composite values or compared to thresholds, e.g., to establish one or more thermal gradient scores or values. In some embodiments, different thermal gradients may be compared to each other to calculate relative values. Once the thermal gradients have been determined at step 615, processing may continue to step 620.

At step 620, the system determines whether operation should be modified or updated based on the determined thermal gradient. The thermal gradients or calculated values at step 620 may be analyzed (e.g., comparison to thresholds, pattern matching, rate of change, absolute change, etc.) to determine that the operation of the device needs to be modified. In some embodiments, different thermal gradients and patterns of thermal gradients may be associated with different problems or forms of compensation, such as an external point heat source, excessive run-time, and development faults within the device. In some embodiments, performance data may be tracked along with thermal gradients over time to establish relationships between different thermal gradients and patterns and different errors or effective compensation techniques. Data structures such as lookup tables may be updated over time (e.g., by remote software updates) to modify responses to measured thermal gradients. If the operation of the device is to be modified based on the measured thermal gradient information, processing may continue to step 625. If the operation is not to be modified, processing may return to step 605.

At step 625, the system updates the operation of the system. Multiple operations may be modified in different implementations, including measurement compensation, device modification, and external measures. In an exemplary embodiment of measurement compensation, a measured output (e.g., linear acceleration, angular velocity, or pressure) may be adjusted based on known effects of a measured thermal gradient. In some embodiments, it may be determined that different thermal gradients or patterns of thermal gradients may modify the output of a sensor, for example, by causing a relative expansion of movable micromechanical components, changing cavity pressure, or modifying operational parameters of electronic components. Based on measured thermal gradients and patterns of thermal gradients, the output value or scaling factors used to calculate the output value may be modified to more accurately reflect the physical input being measured. In an exemplary embodiment of device modification, the operations of the device may be modified such that a similar input value results in a similar output value despite the presence of the thermal gradients. In an exemplary embodiment of an inertial MEMS sensor that has a modified mechanical response to a physical input due to the thermal gradient, the drive or sense voltages of the sensor may be modified such that the electrical output of the sensor is equivalent to the electrical output of the sensor without the thermal gradient. In an exemplary embodiment of external measures, the operations of other components or devices other than the device being measured may be modified, such as by turning another component off or reducing its power consumption temporarily to reduce the temperature effects on the device being measured. Once the measured thermal gradient is reduced or modified to a certain degree, the measured device can continue normal operation temporarily, after which the operation of the system may be returned to normal. In other embodiments, external steps may be taken to modify the thermal gradient, such as turning on internal fans within the system. Whichever form of operational modification is performed, processing may return to step 605 to continue to measure the thermal gradients and modify operations of the device as necessary.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical (MEMS) sensor, comprising:
   a plurality of vertically-stacked semiconductor layers;
   an external bond wire coupled to a first semiconductor layer of the plurality of semiconductor layers at a first bond point;
   a second bond point coupled to the external bond wire at a second semiconductor layer of the plurality of semiconductor layers; and
   a sense circuit coupled to measure a voltage at the second bond point and to calculate a thermal gradient between the first bond point and the second bond point based on the measured voltage.

2. The MEMS sensor of claim 1, wherein the measured voltage comprises a voltage between the second bond point and a voltage at a measurement point of the second semiconductor layer.

3. The MEMS sensor of claim 2, wherein the measurement point is located adjacent to the second bond point.

4. The MEMS sensor of claim 2, wherein the thermal gradient is calculated based on a Seebeck coefficient of the external bond wire, a Seebeck coefficient of the first semiconductor layer, and a Seebeck coefficient of the second semiconductor layer.

5. The MEMS sensor of claim 2, further comprising a third semiconductor layer, wherein the third semiconductor layer is vertically stacked between the first semiconductor layer and the second semiconductor layer.

6. The MEMS sensor of claim 5, wherein the third semiconductor layer comprises a MEMS layer.

7. The MEMS sensor of claim 6, wherein the MEMS layer comprises a movable MEMS structure of a gyroscope, accelerometer, pressure sensor, microphone, or magnetometer.

8. The MEMS sensor of claim 1, wherein the external bond wire comprises gold, aluminum, copper, or silver.

9. The MEMS sensor of claim 8, wherein the third bond point is located adjacent to the second bond point.

10. The MEMS sensor of claim 8, wherein the thermal gradient is calculated based on a Seebeck coefficient of the first external bond wire and a Seebeck coefficient of the second external bond wire.

11. The MEMS sensor of claim 8, wherein the second semiconductor layer comprises a CMOS substrate.

12. The MEMS sensor of claim 8, wherein the second semiconductor layer comprises an LGA substrate.

13. The MEMS sensor of claim 8, further comprising a MEMS layer.

14. The MEMS sensor of claim 13, wherein the MEMS layer comprises a movable MEMS structure of a gyroscope, accelerometer, pressure sensor, microphone, or magnetometer.

15. The MEMS sensor of claim 8, wherein a path of the first bond wire between the first bond point and the second bond point comprises a plurality of series connections between the first semiconductor layer and the second semiconductor layer, and wherein a path of the second bond wire between the first bond point and the third bond point comprises a plurality of series connections between the first semiconductor layer and the second semiconductor layer.

16. The MEMS sensor of claim 1, wherein the external bond wire comprises a first external bond wire, further comprising a second external bond wire coupled to the first bond point and to a third bond point of the second semiconductor layer, wherein the voltage measured by the sense circuit measures the voltage between the second bond point and the third bond point.

17. The MEMS sensor of claim 1, wherein the first bond wire and the second bond wire comprise materials having disparate Seebeck coefficients.

18. The MEMS sensor of claim 17, wherein the disparate materials are selected from the group consisting of gold, aluminum, copper, and silver.

19. An electronic device, comprising:
a plurality of vertically-stacked semiconductor layers;
a first temperature circuit path between a first location on a first semiconductor layer of the plurality of semiconductor layers and a second location on a second semiconductor layer of the plurality of semiconductor layers;
a second temperature circuit path between the first location and a third location on the second semiconductor layer of the plurality of semiconductor layer, wherein the third location is located adjacent to the second location; and
processing circuitry configured to measure a voltage between the second location and the first location, determine a thermal gradient associated with the first and second temperature circuit paths based on the measured voltage, and modify the operation of the electronic device based on the thermal gradient.

20. A microelectromechanical (MEMS) sensor, comprising:
a first temperature circuit path between a first location of the MEMS sensor and a second location of the MEMS sensor;
a second temperature circuit path between the first location of the MEMS sensor and a third location of the MEMS sensor, wherein the third location is adjacent to the second location and wherein the first and second temperature circuit paths define a thermal gradient path of the MEMS sensor; and
processing circuitry configured to measure a voltage between the second location and the first location, determine a thermal gradient for the thermal gradient path based on the measured voltage, and modify the operation of the MEMS sensor based on the thermal gradient.

* * * * *